United States Patent [19]
Nomura et al.

[11] Patent Number: 5,629,562
[45] Date of Patent: May 13, 1997

[54] CONDUCTIVE CONTACT STRUCTURE FOR TWO CONDUCTORS

[75] Inventors: Toshihiro Nomura; Masaaki Hisamoto, both of Kanagawa, Japan

[73] Assignee: Fuji Electric Co., Ltd., Kanagawa, Japan

[21] Appl. No.: 649,473

[22] Filed: May 17, 1996

Related U.S. Application Data

[63] Continuation of Ser. No. 224,843, Apr. 7, 1994, abandoned.

[30] Foreign Application Priority Data

Apr. 8, 1993 [JP] Japan .................................. 5-081000

[51] Int. Cl.$^6$ .......................... H01L 23/16; H01L 23/34; H01L 23/10
[52] U.S. Cl. ........................ 257/717; 257/719; 257/712; 257/683; 257/706
[58] Field of Search ................... 257/717, 718, 257/719, 720, 727, 706, 712, 783, 785, 683, 709; 361/704, 705, 706, 708, 713

[56] References Cited

U.S. PATENT DOCUMENTS

| | | | |
|---|---|---|---|
| 4,092,697 | 5/1978 | Spaight | 257/714 |
| 4,878,108 | 10/1989 | Phelps et al. | 257/718 |
| 5,014,777 | 5/1991 | Sano | 257/718 |
| 5,028,989 | 7/1991 | Naganuma et al. | 257/719 |
| 5,345,107 | 9/1994 | Daikoku et al. | 257/718 |

FOREIGN PATENT DOCUMENTS

| | | |
|---|---|---|
| 0577099A2 | 1/1994 | European Pat. Off. . |
| 2306702 | 11/1988 | Japan . |
| 2-230670 | 9/1990 | Japan . |
| 2249665 | 5/1992 | United Kingdom . |

*Primary Examiner*—Mahshid D. Saadat
*Assistant Examiner*—Jhihan B. Clark
*Attorney, Agent, or Firm*—Finnegan, Henderson, Farabow, Garrett & Dunner, L.L.P.

[57] ABSTRACT

In a conductive contact structure for two conductors, a lower electrode also serves as a cooling element, and two grooves are formed in the lower surface of an electrode. A grease-like insulating material high in thermal conductivity is applied to the lower surface of the electrode except the middle region thereof which is defined by the two grooves; that is, it is applied only to the right and left regions of the lower surface which are located on both sides of the middle region. A pressurizing force is applied through an upper conductor to an electrode whose lower surface is fixed through an insulating board to the upper surface of the electrode. The middle region of the lower surface of the electrode is in contact with the surface of the lower conductor, and the right and left regions are elastically deformed in such a manner that they are slightly raised above the surface of the lower conductor, thus forming spaces therebetween. The spaces thus formed are filled with the insulating material. Thermal conduction; i.e., heat radiation is effected through the right and left regions to which the insulating material have been applied, and electrical conduction is ensured through the middle region to which the insulating material is not applied.

11 Claims, 3 Drawing Sheets

CONDUCTIVE CONTACT STRUCTURE FOR TWO CONDUCTORS

This application is a continuation of application Ser. No. 08/224,843, filed Apr. 7, 1994, now abandoned.

BACKGROUND OF THE INVENTION

1. Field of the Invention

This invention relates to a conductive contact structure for two conductors in which the planar portion of an electrode plate relatively large in area on which for instance flat package type semiconductor elements are fixedly mounted is brought into contact with the planar portion of a conductor under pressure which also serves as a cooling element so that the electrode plate and the conductor are conductive to each other; in which the pressure contact area is improved in electrical conductivity and in thermal conductivity; i.e., heat radiation.

2. Discussion of the Related Art

A conventional conductive contact structure for two conductors will be described with reference to FIG. 5, a side view, which has been proposed by the present, Applicant (under Japanese Patent Application (OPI) No. 230670/1990 (the term "OPI" as used herein means an "unexamined application")). In FIG. 5, reference numeral 50 designates a cooling fin; 54, an upper electrode; 55, a lower electrode; 56, a semiconductor element which is conductively mounted on the lower electrode 55; and 57, a lead wire connected between the upper electrode 54 and the semiconductor element 56. The cooling fin 50 is one of the two conductors, and the lower electrode 55 is the other. The two conductors are brought into contact with each other being pressurized by a force F. More specifically, in this operation, the lower electrode 55 is deformed in such a manner that its middle portion contacts the surface of the cooling fin 50 as much as a width We which is slightly larger than the lateral width of the lower surface of the upper electrode 54, while its both side portions are elastically deformed being slightly raised above the surface of the cooling fin 50. In this case, in order to ensure the electrical conductivity and the thermal conductivity, or heat radiation of the pressure contact surface with a relatively small force F, the following method is employed: A plurality of grooves are formed in the lower surface of the lower electrode 55 in the range of the width We in such a manner that they are extended perpendicular to the surface of the drawing and in parallel with one another. And a grease-like insulating material 9 high in thermal conductivity is applied between the lower surface of the lower electrode 55 and the upper surface of the cooling fin 50. Instead of the method in which the grooves 53 are formed in the middle of the lower surface of the lower electrode 55, the following methods may be employed. In one of the methods, the surface roughness of the lower surface of the lower electrode is set to about 10 to 100 μm. In the other method, the above-described two methods are employed in combination; that is, the grooves are formed in the middle of the lower surface of the lower electrode, and the surface roughness of the lower surface of the lower electrode is adjusted.

The conventional conductive contact structure shown in FIG. 5 suffers from the following difficulties: (1) Machining the lower electrode to form the grooves 53 is rather troublesome, taking time and labor. (2) The electrical conduction is somewhat low in reliability. In other words, in order to eliminate the difficulty that the electrical conduction is low in reliability, it is necessary to increase the pressurizing force to some extent.

SUMMARY OF THE INVENTION

Accordingly, an object of this invention is to eliminate the above-described difficulties accompanying a conventional conductive contact structure for two conductors. More specifically, an object of the invention is to provide a conductive contact structure for two conductors in which the planar surfaces of the two conductors are brought into contact with each other under pressure to make the two conductors conductive to each other, in which the electrical conductivity and the thermal conductivity of the pressure contact surface are improved with a relatively small pressurizing force.

To achieve the above object, the present invention has been achieved by provision of a conductive contact structure for two conductors in which a planar portion of a first conductor and a planar portion of a second conductor are brought into contact with each other under pressure so that the first and second conductors are conductive to each other, one of the planar portions of the first and second conductors is divided into a plurality of regions by grooves in such a manner that those of the regions to which a grease-like insulating material high in thermal conductivity is applied are adjacent through the grooves to the remaining regions to which the insulating material is not applied.

Further, in the conductive contact structure of the invention, the first conductor is an electrode plate having flat semiconductor elements on one side which are conductively secured thereto, and grooves on the other side, and the second conductor is a conductor which also serves as a cooling element.

Still further, in the conductive contact structure of the invention, the regions to which the insulating material is not applied correspond to the active areas of a pressurizing force for pressure contact.

According to the invention, in the conductive contact structure, with a relatively small pressurizing force applied, the thermal conduction; i.e., the heat radiation is carried out through the regions to which the insulating material is applied, and the electrical conduction is effected through the region to which the insulating material is not applied. The insulating material is prevented from moving from the region to which the insulating material is applied to the region to which the insulating material is not applied, by the grooves formed between those regions.

Further, according to the invention, in the conductive contact structure, the regions to, which the insulating material is not applied, correspond to the active areas of the pressurizing force, and therefore the pressure contact is ensured as much.

The above and further objects, features and advantages of the invention will appear more fully from the accompanying drawings and the following detailed description.

DETAILED DESCRIPTION OF THE PREFERRED EMBODIMENTS

A conductive contact structure for two conductors, which constitutes a first embodiment of this invention, will be described with reference to FIGS. 1 and 2.

Figure 1:
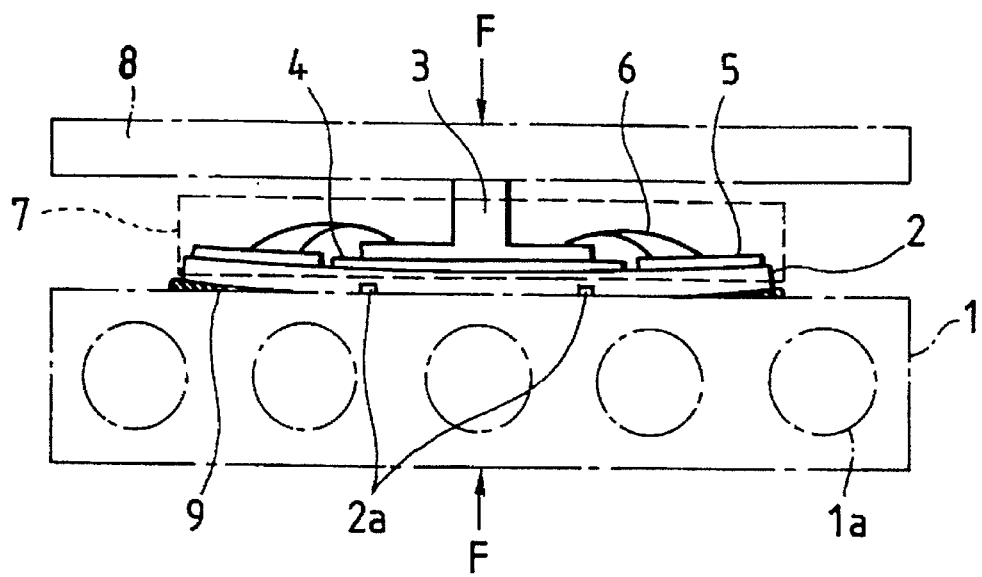
FIG. 1 is a side view showing a conductive contact structure for two conductors according to a first embodiment of the invention.
Figure 2:
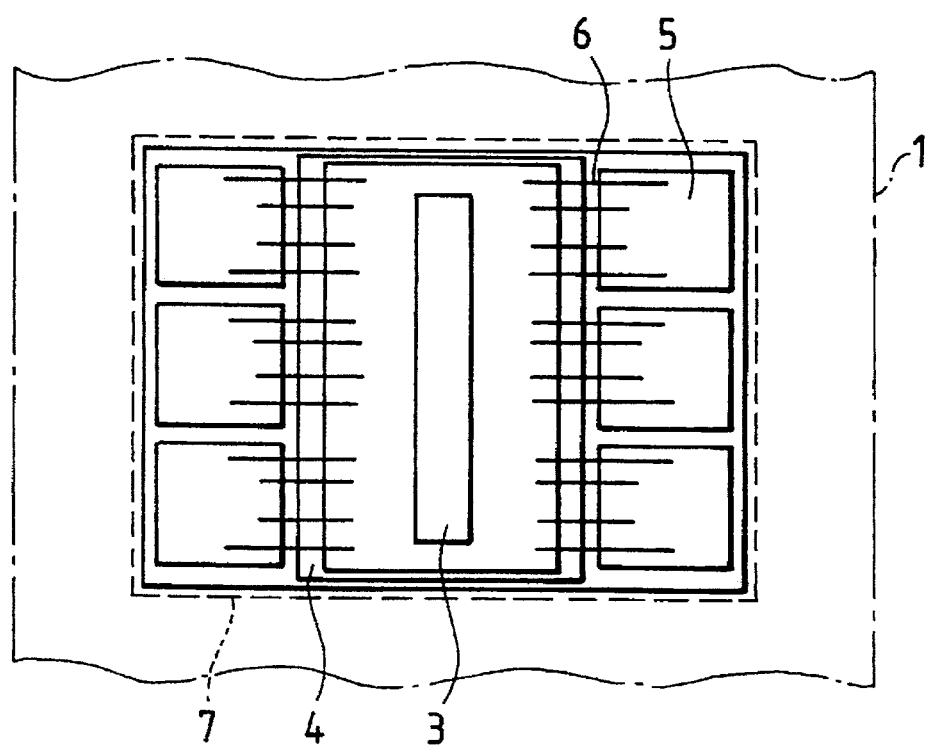
FIG. 2 is a planar view showing the conductive contact structure for two conductors of FIG. 1.

In FIGS. 1 and 2, reference numeral 1 designates a lower electrode, or a first conductor, in which water channels 1a are formed. That is, the lower electrode 1 may be called "a cooling element". Further in FIGS. 1 and 2, reference numeral 2 designates an electrode relatively large in width, or a second conductor; and 3, an electrode relatively small in width. The electrode 2 has two U-shaped grooves 2a in the lower surface which are extended perpendicular to the surface of the drawing. A grease-like insulating material 9 high in thermal conductivity is applied to the lower surface of the electrode 2 except the middle region between the two U-shaped grooves 2a; that is, the insulating material 9 is applied to the right and left areas on both sides of the middle region. A pressurizing force F is applied through an upper conductor 8 to the electrode 3, and the lower surface of the electrode 3 is fixed through an insulating board 4 to the upper surface of the electrode 2. Semiconductor elements 5 are conductively secured to the upper surface of the electrode 2. The semiconductor elements 5 thus secured are connected through lead wires 6 to the electrode 3. A casing 7 indicated by the broken line accommodates the electrodes 2 and 3, the semiconductor elements 5, and the lead wires 6. More specifically, in the casing 7, the electrodes 2 and 3, the semiconductor elements 5, and the lead wires 6 are protected with a filler.

The electrode 2 is deformed in such a manner that its middle region defined by the two grooves 2a is in contact with the surface of the lower conductor 1 which also serves as the cooling element on the one hand, and its right and left regions on both sides of the middle region are elastically deformed so that they are slightly raised above the surface of the lower conductor 1, thus forming spaces therebetween. Therefore, the insulating material 9 applied to the lower conductor 1 is filled in the spaces thus formed. The insulating material 9 is, for instance, the heat radiating silicon grease (KS609) manufactured by Sinetsu Kagaku Kogyo, Inc. Its characteristic is maintained unchanged substantially permanently even at high temperatures around 200° C. or at low temperatures around −55° C. And its dielectric strength is 1.23 KV/0.1 mm.

Hence, with a relatively small pressuring force applied, thermal conduction; i.e., heat radiation is effected through the right and left regions of the electrode 2 to which the insulating material 9 has been applied, while electrical conduction is effected through the middle region of the electrode 2 to which no insulating material is applied. In this connection, it should be noted that the insulating material 9 applied to the right and left regions of the electrode 2 is prevented from being moved to the middle region by the grooves 2a which are formed between the middle region and the right and left regions. Each of the grooves 2a is U-shaped in section, having a width of 1 mm and a depth of 0.5 mm. However, the grooves 2a may be semicircular or V-shaped in section.

The conductive contact structure designed as described above has the following effects or merits: The electrical conductivity and the thermal conductivity are improved, and the semiconductor elements 5 conductively secured to the electrode 2 are improved in quality and in performance. Even if the insulating material 9, spreading over the contact surfaces, enters the place which should be electrically insulated, it will cause no trouble with it. Since the middle region of the electrode 2, which is free from the insulating material 9, corresponds to the active area of the pressurizing force F, the pressure contact is ensured as much, which results in an improvement of the electrical conductivity.

Figure 3:
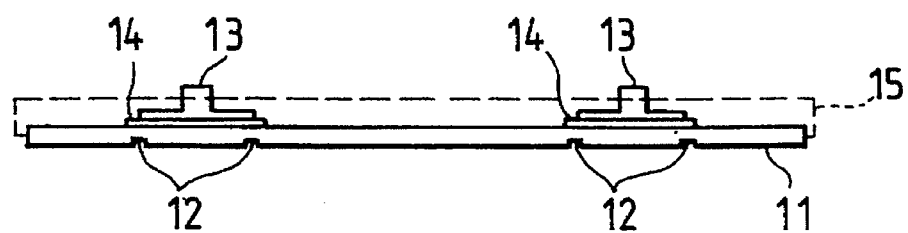
FIG. 3 is a side view showing a conductive contact structure for two conductors according to a second embodiment of the invention.
Figure 4:
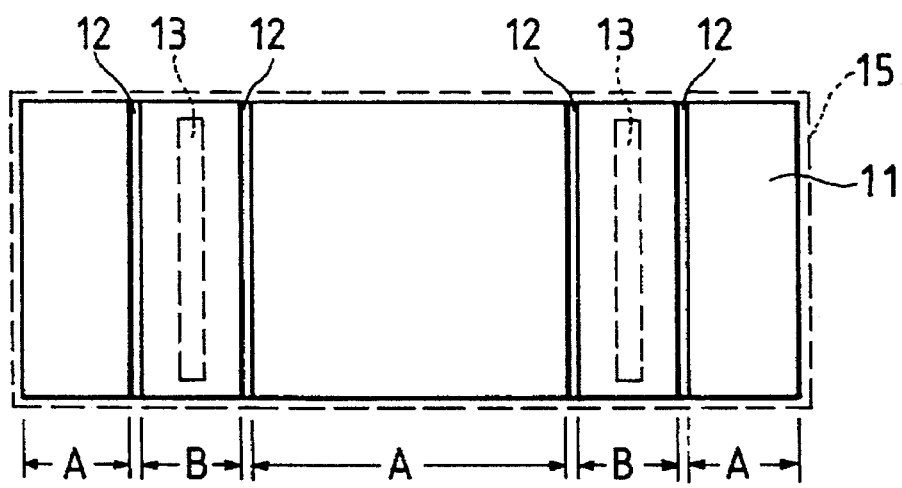
FIG. 4 is a bottom view showing the conductive contact structure for two conductors of FIG. 3.
Figure 5:
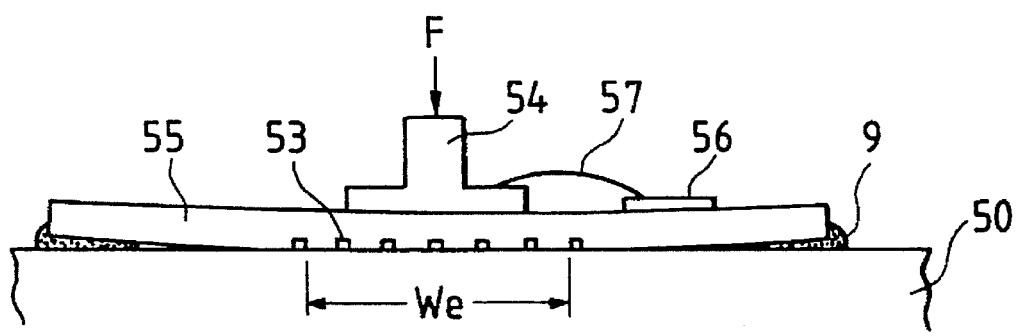
FIG. 5 is a side view of a conventional conductive contact structure for two conductors.

A second embodiment of the invention will be described with reference to FIGS. 3 and 4. Two pairs of grooves 12 are formed in the right and left regions of the lower surface of an electrode 11, respectively, in such a manner that they are extended perpendicular to the surface of the drawing. Two protruded electrodes 13 are fixed through insulating boards 14 to the upper surface of the electrode 11 at two positions which correspond to the right and left positions of the pairs of grooves 12. A pressurizing force (not shown) is applied to the electrodes 13 (cf. FIG. 1). A casing 15 indicated by the broken line accommodates the electrodes 11 and 13, semiconductor elements (not shown), and lead wires (not shown). More specifically, in the casing, the electrodes 11 and 13, the semiconductor elements, and the lead wires are protected with a filler. Of the regions defined by the grooves 12, those A are applied with the insulating material 9, to perform thermal conduction; i.e., heat radiation. The remaining regions B are not applied with the insulating material 9, to perform electrical conduction. The grooves 12 are equal to those 2a in the first embodiment.

Figure 6:
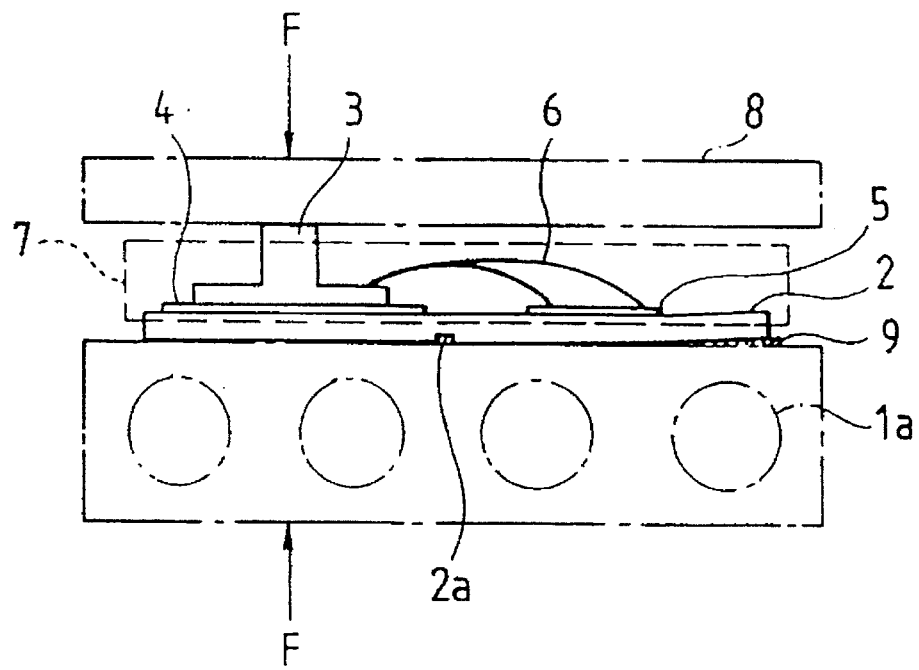
FIG. 6 is a side view showing a conductive contact structure for two conductors according to a third embodiment of the invention.
Figures 7A, 7B, 7C:
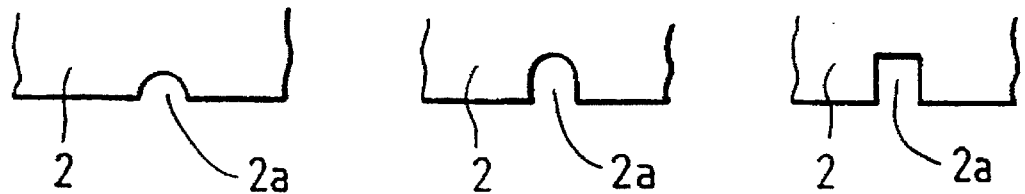
FIGS. 7(a) to 7(f) are side view of grooves formed in an electrode according to the present invention.
Figures 7D, 7E, 7F:
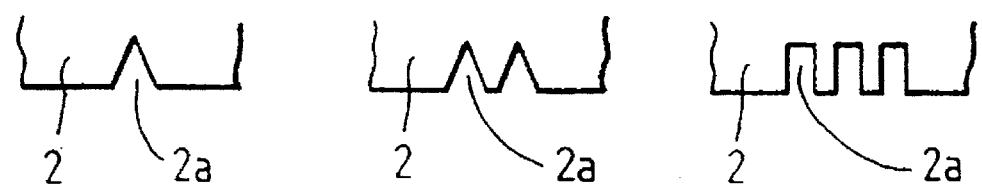

In the foregoing embodiments, at least two grooves are formed in the electrode. However, as shown in FIG. 6, a single groove 2a may be formed in the electrode 2 so as to prevent the insulating material 9 applied to the right region from being moved to the left region of the electrode 2.

FIGS. 7(a) to 7(f) show samples of the configurations of the groove 2a. In FIGS. 7(a) to 7(d), one groove 2a is formed in the electrode 2, whereas in FIGS. 7(e) and 7(f), a plurality of grooves are formed in the electrode 2. However, both cases have the same effects. Further, the groove may be straight or curved.

As was described above, in the conductive contact structure of the invention, with a relatively small pressurizing force applied, the thermal conduction; i.e., the heat radiation is carried out through the regions to which the insulating material is applied, and the electrical conduction is effected through the region to which the insulating material is not applied. The insulating material is prevented from moving from the region to which the insulating material is applied to the region to which the insulating material is not applied by the grooves formed between those regions. Hence, with a relatively small pressurizing force applied, the electrical conductivity and the thermal conductivity are improved, and circuit parts or elements mounted on the two conductors are improved in quality and in performance. Even if the insulating material, spreading over the contact surfaces, enters the place which should be electrically insulated, it will cause no trouble with it.

Further, in the conductive contact structure, the first conductor is the electrode plate relatively large in area, and the second conductor is the conductor which also serves as a cooling element. Therefore, in the structure, the area for electrical conduction and thermal conduction is large, and the flat package type semiconductor elements conductively mounted on the electrode plate are ensured in quality and in performance as much.

Still further, in the conductive contact structure of the invention, the regions to which the insulating material is not applied, correspond to the active areas of the pressurizing force, and accordingly the pressure contact is ensured, and the electrical conductivity is improved.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A conductive contact structure for two conductors, comprising:

a first conductor having at least one planar portion;

a second conductor having at least one planar portion, said planar portions of said first and second conductors being conductively brought into contact with each other under pressure; and a grease-like insulating material which is high in thermal conductivity and applied to one of said planar portions of said first and second conductors;

wherein one of said planar portions of said first and said second conductors is divided into a pair of first planar regions and a second planar region by at least two grooves, the second planar region being placed between the pair of first planar regions and being uninterrupted by grooves, said grease-like insulating material being applied only to said pair of first planar regions and no grease-like insulating material being applied to said second planar region.

2. A conductive contact structure as claimed in claim 1, wherein flat type semiconductor elements are conductively secured to a first side of said first conductor, and said groove is defined in a second side of said first conductor.

3. A conductive contact structure as claimed in claim 1, wherein said second planar region corresponds to the active areas of a pressurizing force for pressure contact.

4. A conductive contact structure as claimed in claim 1, wherein each of said grooves is shaped to prevent said grease-like insulating material from entering from said first planar region to said second planar region.

5. A conductive contact structure as claimed in claim 1, wherein said grease-like insulating material comprises a heat radiating silicon grease.

6. A conductive contact structure as claimed in claim 1, wherein said first conductor contains water channels which act as cooling elements.

7. A conductive contact structure as claimed in claim 2, wherein said second planar region corresponds to the active areas of a pressurizing force for pressure contact.

8. A conductive contact structure as claimed in claim 4, wherein said groove comprises a plurality of grooves formed in parallel with each other.

9. A conductive contact structure as claimed in claim 4, wherein each of said grooves is U-shaped.

10. A conductive contact structure as claimed in claim 4, wherein each of said groove is V-shaped.

11. A conductive contact structure as claimed in claim 4, wherein each of said groove is semicircular.

* * * * *

UNITED STATES PATENT AND TRADEMARK OFFICE
CERTIFICATE OF CORRECTION

PATENT NO. : 5,629,562
DATED : May 13, 1997
INVENTOR(S) : Toshihiro NOMURA et al.

It is certified that error appears in the above-indentified patent and that said Letters Patent is hereby corrected as shown below:

Claim 10, column 6, line 31, "groove" should read -- grooves --.

Claim 11, column 6, line 33, "groove" should read -- grooves --.

Signed and Sealed this

Fifth Day of August, 1997

*Attest:*

BRUCE LEHMAN

*Attesting Officer*  *Commissioner of Patents and Trademarks*